(12) United States Patent
Kim et al.

(10) Patent No.: US 11,594,702 B2
(45) Date of Patent: Feb. 28, 2023

(54) WINDOW GLASS, DISPLAY DEVICE INCLUDING THE SAME, AND METHOD OF MANUFACTURING A DISPLAY DEVICE

(71) Applicant: Samsung Display Co., Ltd., Yongin-Si (KR)

(72) Inventors: Hyo-Seop Kim, Asan-si (KR); Myung-Hwan Kim, Seongnam-si (KR); Seung Yo Yang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 156 days.

(21) Appl. No.: 17/068,996

(22) Filed: Oct. 13, 2020

(65) Prior Publication Data

US 2021/0135146 A1 May 6, 2021

(30) Foreign Application Priority Data

Nov. 5, 2019 (KR) .......................... 10-2019-0140407

(51) Int. Cl.
| | |
|---|---|
| *H01L 51/52* | (2006.01) |
| *H01L 27/32* | (2006.01) |
| *H01L 51/56* | (2006.01) |
| *H01L 51/00* | (2006.01) |

(52) U.S. Cl.
CPC ........ *H01L 51/524* (2013.01); *H01L 27/3244* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 11,048,295 | B1* | 6/2021 | Smeeton | ............... G06F 1/1609 |
| 2015/0043174 | A1* | 2/2015 | Han | ................... G02F 1/13452 |
| | | | | 428/156 |
| 2018/0046220 | A1* | 2/2018 | Kim | ........................ H01L 27/32 |
| 2018/0217639 | A1* | 8/2018 | Jones | ..................... G09F 9/301 |
| 2021/0107829 | A1* | 4/2021 | Chen | ................... C03C 23/0025 |
| 2021/0108077 | A1* | 4/2021 | Berleue | .................... C08K 5/09 |
| 2021/0216100 | A1* | 7/2021 | Smeeton | ................ G09F 9/301 |

FOREIGN PATENT DOCUMENTS

| | | | | |
|---|---|---|---|---|
| KR | 1020150140501 A | | 12/2015 | |
| WO | WO-2021041882 A1 | * | 3/2021 | ........... C03C 21/002 |

OTHER PUBLICATIONS

U.S. Appl. No. 62/915,727 (Year: 2019).*

* cited by examiner

*Primary Examiner* — J. E. Schoenholtz
(74) *Attorney, Agent, or Firm* — Cantor Colburn LLP

(57) ABSTRACT

A window glass includes a first surface and a second surface opposite to the first surface. A second area extending in a second direction, a third area spaced apart from the second area in a first direction perpendicular to the second direction and extending in the second direction, a first area disposed between the second area and the third area, a first buffer area disposed between the first area and the second area, and a second buffer area disposed between the first area and the third area are defined on the second surface. The first area has a first thickness, and each of the second and third areas has a second thickness greater than the first thickness. A plurality of groove patterns is defined in the first buffer area and the second buffer area.

20 Claims, 9 Drawing Sheets

FIG. 1A
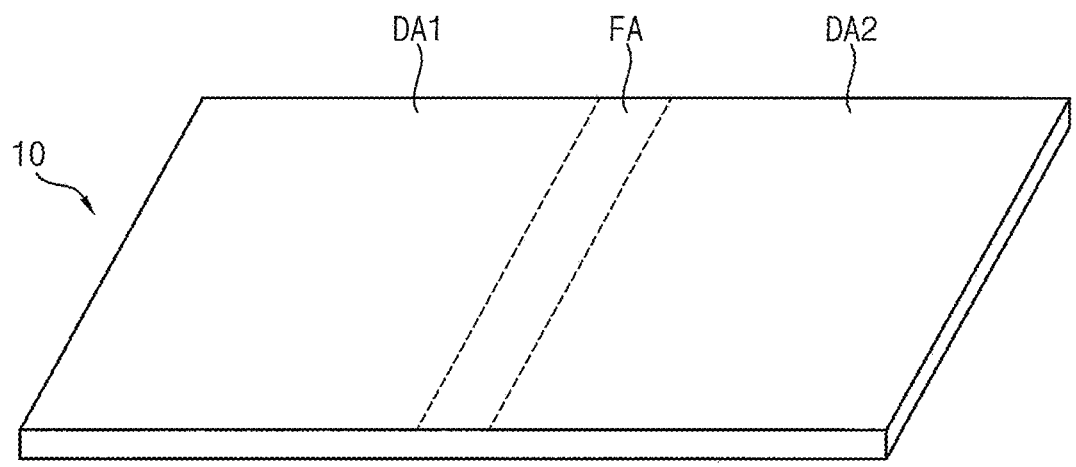
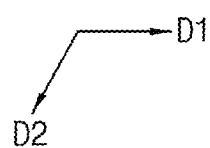
FIG. 1B
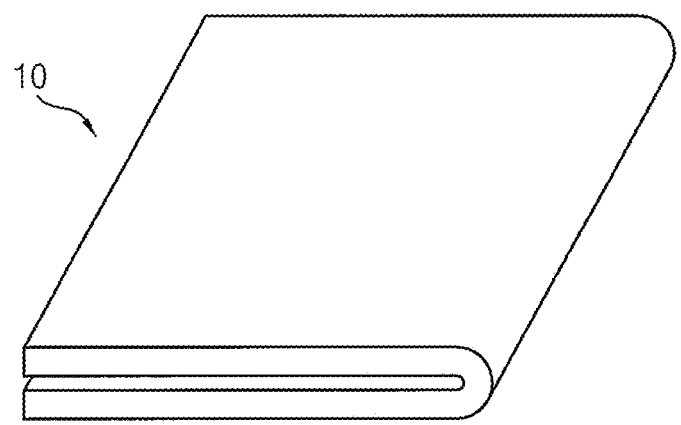

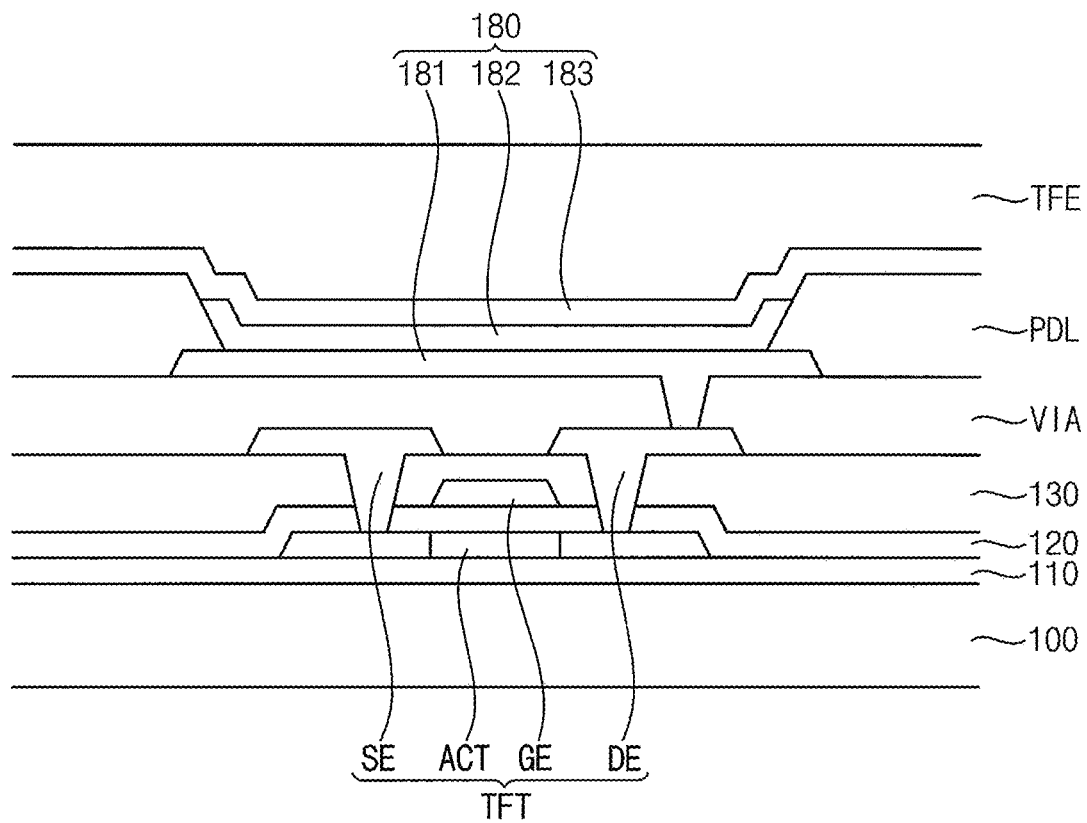

WINDOW GLASS, DISPLAY DEVICE INCLUDING THE SAME, AND METHOD OF MANUFACTURING A DISPLAY DEVICE

This application claims priority to Korean Patent Application No. 10-2019-0140407, filed on Nov. 5, 2019, and all the benefits accruing therefrom under 35 USC § 119, the content of which in its entirety is herein incorporated by reference.

BACKGROUND

1. Field

Embodiments relate generally to a window glass, a display device including the window glass, and a method of manufacturing the display device. More particularly, embodiments of the invention relate to a window glass used for a foldable display device, a display device including the window glass, and a method of manufacturing the display device.

2. Description of the Related Art

Recently, as the technology improves, display devices having smaller sizes, lighter weights, and superior performance have been produced. Conventional cathode ray tube ("CRT") televisions have been widely used for display devices due to desired characteristics in terms of performance and price. Recently, however, a display device, such as a plasma display device, a liquid crystal display device, and an organic light emitting diode display device having desired characteristics in terms of miniaturization or portability such as miniaturization, light weight, and low power consumption has been spotlighted.

Recently, various types of display devices other than flat panel display devices, e.g., a curved display device, a bending-type display device, a foldable display device, a rollable display device, and a stretchable display device, have been developed. In particular, a foldable display device which may be bidirectionally foldable about a folding axis has been developed.

SUMMARY

In a foldable display device, a structure using a window glass that uses a ultra-thin glass ("UTG") or a structure using a transparent polyimide film has been proposed to protect a top of a display surface. However, such a structure may have problems such as a cost effective, low protective performance, and difficulties in manufacturing processes.

Some embodiments provide a window glass with reduced manufacturing cost and improved visibility, which is suitable for a foldable display device.

Some embodiments provide a display device including the window glass.

Some embodiments provide a method of manufacturing the display device.

According to an embodiment, a window glass includes a first surface and a second surface opposite to the first surface. In such an embodiment, a second area extending in a second direction, a third area spaced apart from the second area in a first direction perpendicular to the second direction and extending in the second direction, a first area disposed between the second area and the third area, a first buffer area disposed between the first area and the second area, and a second buffer area disposed between the first area and the third area are defined on the second surface. In such an embodiment, the first area has a first thickness, and each of the second and third areas has a second thickness greater than the first thickness. In such an embodiment, a plurality of groove patterns is defined in the first buffer area and the second buffer area.

In an embodiment, a density of the groove patterns in the first buffer area may gradually increase as being away farther from the second area to the first area.

In an embodiment, a pattern width of the groove pattern may be between about 20 micrometers (µm) and about 30 µm.

In an embodiment, an average thickness of the first buffer area may gradually decrease as being away farther from the second area to the first area.

In an embodiment, the second thickness may be greater than the first thickness by about 1.5 times or more.

In an embodiment, the groove pattern may be a gradual pattern.

According to an embodiment, a display device includes a display panel including a first display area, a second display area spaced apart from the first display area in a first direction, and a folding area disposed between the first display area and the second display area and extending in a second direction perpendicular to the first direction, an adhesive layer disposed on the display panel, and a window glass disposed on the adhesive layer. In such an embodiment, the window glass includes a first surface and a second surface opposite to the first surface, where a second area extending in the second direction, a third area spaced apart from the second area in the first direction and extending in the second direction, a first area disposed between the second area and the third area, a first buffer area disposed between the first area and the second area, and a second buffer area disposed between the first area and the third area are defined on the second surface. In such an embodiment, the first area has a first thickness, and each of the second and third areas has a second thickness greater than the first thickness. In such an embodiment, a plurality of groove patterns is defined in the first buffer area and the second buffer area.

In an embodiment, a density of the groove patterns in the first buffer area of the window glass may gradually increase as being away farther from the second area to the first area.

In an embodiment, a pattern width of the groove pattern of the window glass may be between about 20 µm and about 30 µm.

In an embodiment, an average thickness of the first buffer area of the window glass may gradually decrease as being away farther from the second area to the first area.

In an embodiment, the second thickness of the window glass may be greater than the first thickness by about 1.5 times or more.

In an embodiment, the folding area may correspond to a part of the first area.

In an embodiment, the first display area may correspond to the second area, the first buffer area and a part of the first area, and the second display area may correspond to the third area, the second buffer area and a part of the first area.

In an embodiment, the display panel may be a flexible display panel, and the display panel may include a base substrate, a thin film transistor disposed on the base substrate, a light emitting structure disposed on the thin film transistor, and a thin film encapsulation layer disposed on the light emitting structure.

In an embodiment, the first surface of the window glass may be flat, a recess may be defined in the first area, the first buffer area, and the second buffer area on the second surface, and a part of the adhesive layer may be accommodated in the recess.

In an embodiment, the groove pattern may be a gradual pattern.

According to an embodiment, a method of manufacturing a display device includes preparing a window glass including a first surface and a second surface opposite to the first surface, and adhering the window glass onto a display panel by using an adhesive layer. In such an embodiment, the preparing the window glass includes: providing a photoresist pattern on the second surface, where a second area extending in a second direction, a third area spaced apart from the second area in a first direction perpendicular to the second direction and extending in the second direction, a first area disposed between the second area and the third area, a first buffer area disposed between the first area and the second area, and a second buffer area disposed between the first area and the third area are defined on the second surface; etching the second surface by using the photoresist pattern as an etching barrier; and removing the photoresist pattern. In such an embodiment, the etching the second surface includes providing the photoresist pattern to cover the second surface in the second and third areas, to expose the second surface in the first area, and to partially expose the second surface in the first and second buffer areas.

In an embodiment, the etching the second surface may further include wet-etching the window glass by using hydrofluoric acid.

In an embodiment, a plurality of opening patterns may be defined through the photoresist in the first buffer area, and an aperture ratio by the opening patterns may gradually increase as being away farther from the second area to the first area.

In an embodiment, the opening patterns may be gradual patterns.

In embodiments, a display device may include a window glass including second and third areas having a second thickness and a first area having a first thickness smaller than the second thickness, and the folding may be performed in the folding area located in the first area, so that a foldable display device including the window glass, which is foldable with improved protection strength, improved visibility, and reduced manufacturing cost, may be implemented.

BRIEF DESCRIPTION OF THE DRAWINGS

FIG. 1A is a perspective view showing a display device according to an embodiment in a state where the display device is unfolded.

FIG. 1B is a perspective view showing the display device of FIG. 1A in a state where the display device is folded.

FIG. 6 is a sectional view showing an embodiment of a display panel of the display device of FIG. 2.

DETAILED DESCRIPTION

Figure 2:
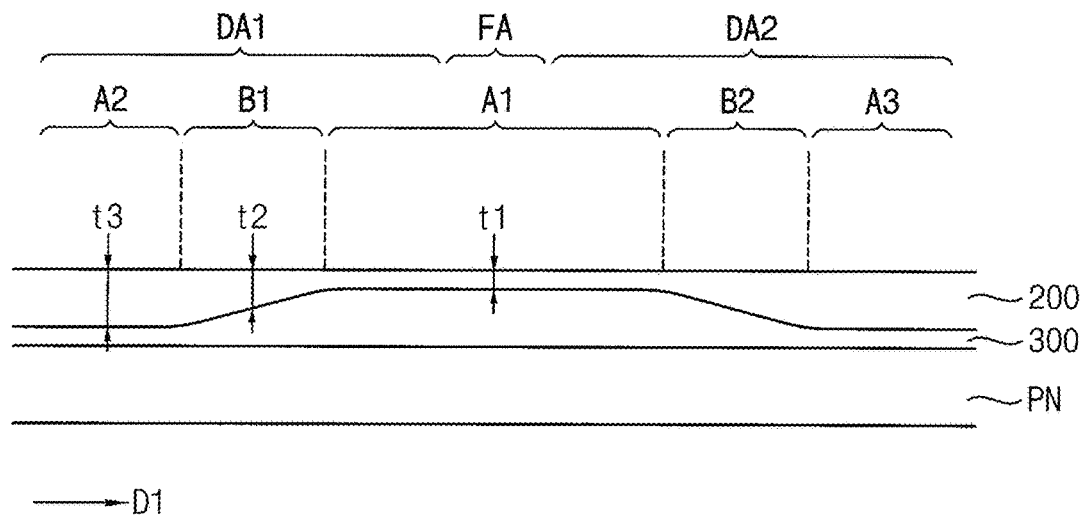
FIG. 2 is a sectional view showing a periphery of a folding area of the display device of FIG. 1A.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1A is a perspective view showing a display device according to an embodiment in a state where the display device is unfolded, and FIG. 1B is a perspective view showing the display device of FIG. 1A in a state where the display device is folded.

Referring to FIGS. 1A and 1B, an embodiment of a display device 10 may be a foldable display device as illustrated, but the invention is not limited thereto. In addition, embodiments of the display device 10 according to the invention may be applied to various display devices such as a curved display device, a bending-type display device, a rollable display device, and a stretchable display device. Further, embodiments of the display device 10 according to the invention may be used in small and medium electronic devices such as mobile phones, personal computers, notebook computers, personal digital terminals, automobile navigation units, game machines, portable electronic devices, wristwatch-type electronic devices, or cameras as well as large electronic devices such as televisions or external billboards.

An embodiment of the display device 10 may include a plurality of areas divided on a surface thereof. The display device 10 may be divided into a display area and a non-display area (not shown) based on an image display thereon. The display area is an area where an image is displayed, and the non-display area is an area adjacent to the display area and in which an image is not displayed. In one embodiment, for example, a display area DA may have a rectangular shape. The non-display area may be adjacent to the display area or may surround the display area. In an alternative embodiment, the non-display area may be omitted.

The display area of the display device 10 may be parallel to a surface defined by a first direction D1 and a second direction D2 perpendicular to the first direction D1. Herein, the surface defined by the first direction D1 and the second direction D3 may be perpendicular to a thickness direction of the display device 10 in an unfolded state.

The display area may include a first display area DA1, a second display area DA2 spaced apart from the first display area DA1 in the first direction D1, and a folding area FA disposed between the first display area DA1 and the second display area DA2 and extending in the second direction D2.

The folding area FA of the display device 10 may be folded about a folding axis according to an operation. The first display area DA1 and the second display area DA2 may be non-folding areas which are not folded. The folding axis may extend in a same direction as the second direction D2.

Referring to FIG. 1B, the folding area FA may be folded about the folding axis in a way such that a display surface of the first display area DA1 and a display surface of the second display area DA2 face each other. In such an embodiment, a bottom surface of the display device 10 may be exposed to an outside or define an outer surface.

In an embodiment, as described above, the display device 10 may be folded in a way such that the display surface of the first display area DA1 and the display surface of the second display area DA2 face each other, which is defined as "in-folding". Although not shown, the display device 10 may be folded about the folding axis in a way such that the display surface of the first display area DA1 and the display surface of the second display area DA2 face outward, which may be defined as "out-folding".

Figure 3:
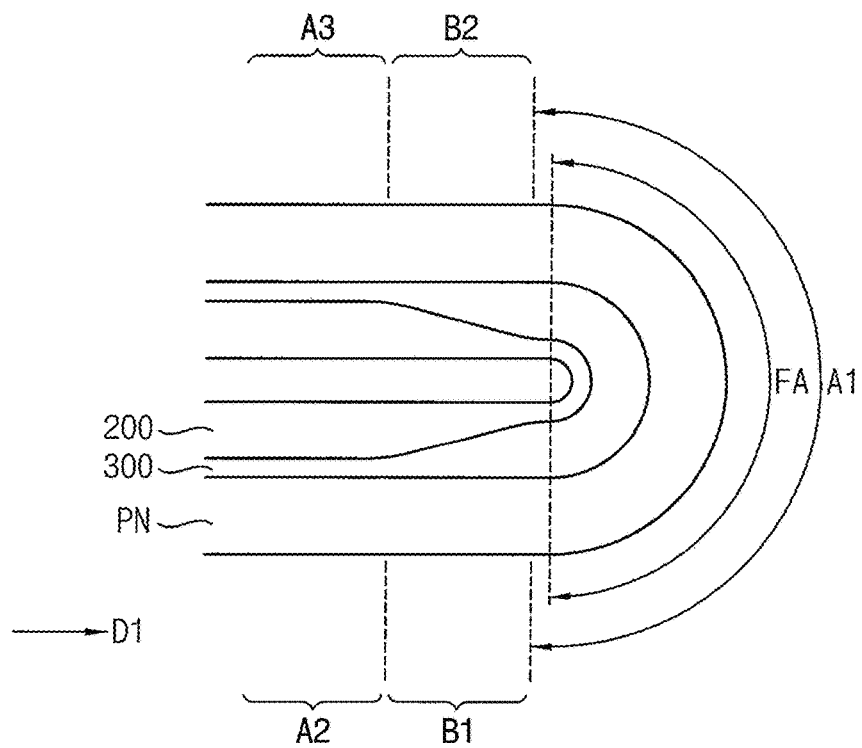
FIG. 3 is a sectional view showing the periphery of the folding area in a state where the display device of FIG. 2 is folded.

FIG. 2 is a sectional view showing a periphery of a folding area of the display device of FIG. 1A, and FIG. 3 is a sectional view showing the periphery of the folding area in a state where the display device of FIG. 2 is folded.

Referring to FIGS. 2 and 3, an embodiment of the display device may include a display panel PN, a window glass 200, and an adhesive layer 300.

The display panel PN may be a flexible display panel. In one embodiment, for example, the display panel PN may be a flexible organic light emitting diode display panel. The display panel PN will be described in greater detail below with reference to FIG. 6.

The adhesive layer 300 may be disposed on a display surface of the display panel PN to adhere the display panel PN and the window glass 200 to each other.

In an embodiment, the window glass 200 may include a first surface and a second surface opposite to the first surface. The second surface is a surface which is adhered to the adhesive layer 300, and is a bottom surface facing the display panel PN in the drawing.

The window glass 200 may include a second area A2 extending in the second direction D2 (see FIG. 1), a third area A3 spaced apart from the second area A2 in the first direction D1 perpendicular to the second direction and extending in the second direction D2, a first area A1 disposed between the second area A2 and the third area A3, a first buffer area B1 disposed between the first area A1 and the second area A2, and a second buffer area B2 disposed between the first area A1 and the third area A3.

In such an embodiment, the first display area DA1, which is a non-folding area, may correspond to the second area A2, the first buffer area B1, and a part of the first area A1. In such an embodiment, the second display area DA2, which is a non-folding area, may correspond to the third area A3, the second buffer area B2, and a part of the first area A1.

The folding area FA may correspond to a part of the first area A1.

The first area A1 may have a first thickness t1. Each of the second area A2 and the third area A3 may have a third thickness t3 greater than the first thickness t1. A second thicknesses t2 of each of the first and second buffer areas B1 and B2 may gradually increase in a direction from the first area A1 to the second or third areas A2 or A3. In an embodiment, groove patterns, which will be described below, may be defined or formed in the first and second buffer areas B1 and B2, and the second thickness t2 refers to an average thickness.

The third thickness t3 may be greater than the first thickness t1 by about 1.5 times or more. In one embodiment, for example, the first thickness t1 may be less than or equal to about 30 micrometers (μm), and the third thickness t3 may be in a range of about 50 μm to about 70 μm. In such an embodiment, the window glass 200 may be manufactured by using a thin film glass having a predetermined thickness or more without using an expensive ultra-thin glass, and by etching the second surface in the first area A1 and the first and second buffer areas B1 and B2. Accordingly, the first thickness t1 of the first area A1 corresponding to the folding area FA may be reduced to a level suitable for the folding, and portions corresponding to the second area A2 and the third area A3 may have a sufficient thickness to obtain effective protection strength.

In an embodiment, the first and second buffer areas B1 and B2 may have the groove patterns having a predetermined size or a fine size enough not to be visually recognized by a user, and the second thickness t2 gradually changes as moving in the first direction D1, so that a step difference due to a difference between the first thickness t1 and the third thickness t3 may not be visually recognized by the user. Accordingly, in such an embodiment, the window glass may be effectively foldable while having improved protection strength in the second area A2 and the third area A3 without degrading visibility. In such an embodiment, the window may be allowed to be manufactured with relatively low cost compared with a conventional window glass for a foldable display device, e.g., an ultra-thin glass ("UTG").

In such an embodiment, when the display device is unfolded, the first surface may be flat, and a recess may be formed on the second surface, so that a thickness difference may occur. In such an embodiment, the second surface may make contact with the adhesive layer 300, and the adhesive layer 300 may have elasticity, so that the adhesive layer 300 may be accommodated in the recess. Accordingly, the first surface of the window glass 200 may be a flat surface.

Figure 4:
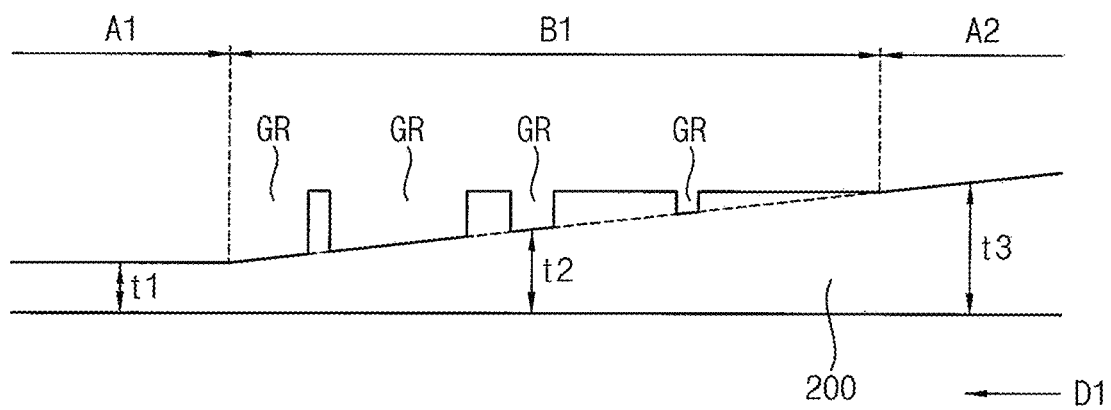
FIG. 4 is an enlarged sectional view showing a periphery of a first buffer area of the display device of FIG. 2.
Figure 5:
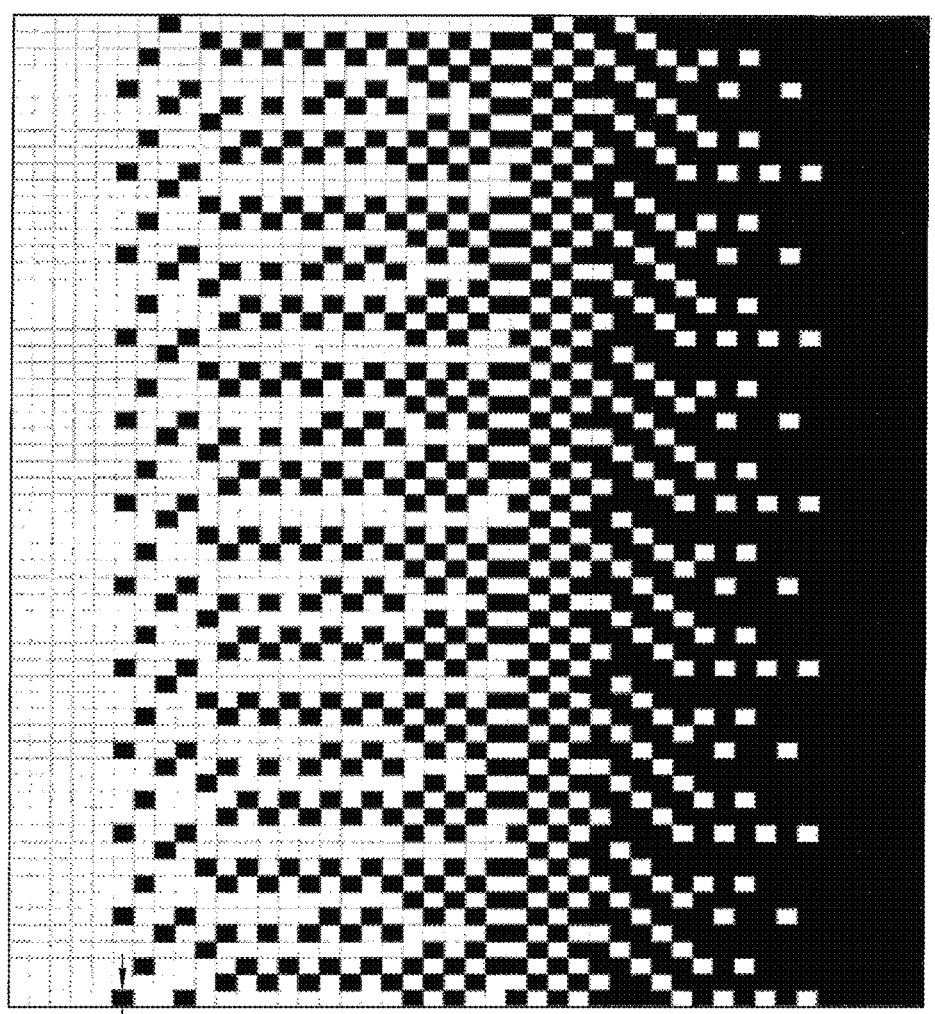
FIG. 5 is a plan view showing a periphery of the first buffer area of the display device of FIG. 4.

FIG. 4 is an enlarged sectional view showing a periphery of a first buffer area of the display device of FIG. 2, and FIG. 5 is a plan view showing a periphery of the first buffer area of the display device of FIG. 4.

Referring to FIGS. 4 and 5, in an embodiment, groove patterns GR may be defined or formed in the first buffer area B1. The groove patterns GR may be defined or formed on the second surface of the window glass 200, and may be arranged in a way such that a density of the groove patterns GR gradually increases as being away farther from the second area A2 to the first area A1, that is, in the first direction D1. Herein, the density of the groove pattern GR may be defined as a total area of the groove pattern GR in a unit area. In such an embodiment, a depth of the groove pattern GR may gradually increase as being away farther from the second area A2 to the first area A1, that is, in the first direction D1.

Accordingly, an average thickness of the first buffer area B1 of the window glass 200 may gradually decrease as being away farther from the second area A2 to the first area A1, that is, in the first direction D1.

In an embodiment, as shown in FIG. 4, the groove pattern GR may include a gradual pattern, but is not limited thereto. In an embodiment, the groove pattern GR may include various patterns which may not be visually recognized by the user. A width w of a minimum unit of the groove pattern GR may be about in a range of about 20 μm to about 30 μm, so that the groove pattern GR may not be visually recognized by the user.

FIG. 6 is a sectional view showing an embodiment of a display panel of the display device of FIG. 2.

Referring to FIG. 6, an embodiment of the display device may include a base substrate 100, a buffer layer 110, an active pattern ACT of a thin film transistor TFT, a first insulating layer 120, a gate electrode GE of the thin film transistor TFT, a second insulating layer 130, source and drain electrodes SE and DE of the thin film transistor TFT, a via insulating layer VIA, a pixel defining layer PDL, a light emitting structure 180, and a thin film encapsulation layer TFE.

The base substrate 100 may be a transparent resin substrate having flexibility. In an embodiment, the transparent resin substrate which may be used as the base substrate 100 includes a polyimide substrate, for example.

The buffer layer 110 may be disposed over the base substrate 100. The buffer layer 110 may prevent metal atoms or impurities from diffusing from the base substrate 100 into the active pattern ACT, and may control a heat transfer rate during a crystallization process for forming the active pattern ACT to obtain a substantially uniform active pattern ACT. In an embodiment, where a surface of the base substrate 100 is not uniform, the buffer layer may serve to improve flatness of the surface of the base substrate 100.

The active pattern ACT may be disposed on the buffer layer 110. The active pattern ACT may include poly crystal silicon. In an alternative embodiment, the active pattern ACT may include an oxide semiconductor. The active pattern ACT may include a drain region and a source region which are doped with impurities, and a channel region disposed between the drain region and the source region.

The first insulating layer 120 may be disposed on the buffer layer 110 on which the active pattern ACT is disposed. The first insulating layer 120 may include an inorganic insulating material or an organic insulating material.

A gate pattern may be disposed on the first insulating layer 120. The gate pattern may include the gate electrode GE. The gate pattern may further include a signal wire such as a gate line for driving the display device.

The second insulating layer 130 may be disposed on the first insulating layer 120 on which the gate pattern is disposed. The second insulating layer 130 may include an inorganic insulating material or an organic insulating material.

A source-drain pattern may be disposed on the second insulating layer 130. The source-drain pattern may include the source electrode SE and the drain electrode DE. The source-drain pattern may further include a signal wire such as a data line for driving the display device.

The via insulating layer VIA may be disposed on the second insulating layer 130 on which the source-drain pattern is disposed. The via insulating layer VIA may have a single-layer structure or a multilayer structure including at least two insulating films.

The light emitting structure 180 may include a first electrode 181, a light emitting layer 182, and a second electrode 183.

The first electrode 181 may be disposed on the via insulating layer VIA. In an embodiment, the first electrode 181 may be formed by using a reflective material or a transmissive material depending on a light emitting scheme of the display device.

The pixel defining layer PDL may be disposed on the via insulating layer VIA on which the first electrode 181 is disposed. The pixel defining layer PDL may be formed by using an organic material, an inorganic material, and the like. In an embodiment, the pixel defining layer PDL may be etched to form an opening therethrough to partially expose the first electrode 181. An emission area and a non-emission area of the display device may be defined by the opening of the pixel defining layer PDL. For example, a portion where the opening of the pixel defining layer PDL is located may correspond to the emission area, and the non-emission area may correspond to a portion adjacent to the opening of the pixel defining layer PDL.

The light emitting layer 182 may be disposed on the first electrode 181 exposed through the opening of the pixel defining layer PDL. In an embodiment, the light emitting layer 182 may extend onto a side wall of the opening of the pixel defining layer PDL. In an embodiment, the light emitting layer 182 may have a multilayer structure including an organic light emitting layer EL, a hole injection layer HIL, a hole transport layer HTL, an electron transport layer ETL, an electron injection layer EIL, and the like. In an alternative embodiment, except for the organic light emitting layer, the hole injection layer, the hole transport layer, the electron transport layer, the electron injection layer, and the like may be commonly provided or formed to correspond to a plurality of pixels. The organic light emitting layer of the light emitting layer 182 may be formed by using light emitting materials for generating different color lights such as red light, green light, and blue light according to each pixel of the display device. According to another alternative embodiment, the organic light emitting layer of the light emitting layer 182 may have a structure in which a plurality of light emitting materials for implementing different color lights such as red light, green light, and blue light are stacked one on another to emit white light. In such an embodiment, the above light emitting structures may be commonly provided or formed to correspond to the pixels, and the pixels may be classified by a color filter layer.

The second electrode 183 may be disposed on the pixel defining layer PDL and the light emitting layer 182. In an embodiment, the second electrode 183 may include a transmissive material or a reflective material depending on the light emitting scheme of the display device.

The thin film encapsulation layer TFE may be disposed on the second electrode 183. The thin film encapsulation layer TFE may prevent moisture and oxygen from penetrating from an outside. The thin film encapsulation layer TFE may include at least one organic layer and at least one inorganic layer. The at least one organic layer and the at least one inorganic layer may be alternately stacked on each other. In one embodiment, for example, the thin film encapsulation layer TFE may include two inorganic layers and one organic layer disposed therebetween, but the embodiments are not limited thereto.

The adhesive layer (see 300 of FIG. 2) may be adhered onto the thin film encapsulation layer TFE.

FIGS. 7A to 7F are sectional views and a plan view showing a method of manufacturing a display device according to embodiments.

Figure 7A:
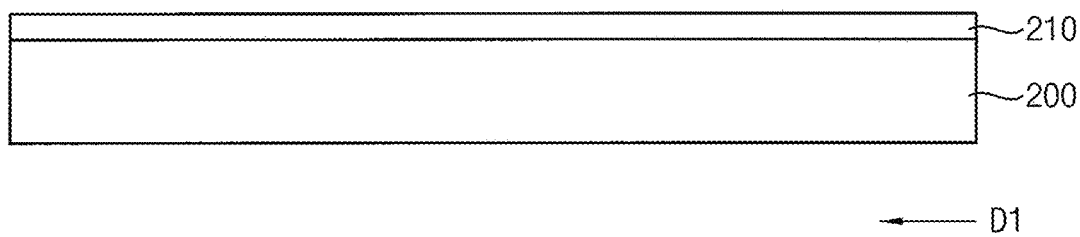
FIGS. 7A to 7F are sectional views and a plan view showing a method of manufacturing a display device according to an embodiment.

Referring to FIG. 7A, a photoresist layer 210 may be provided or formed on the window glass 200. The window glass 200 may include a first surface and a second surface opposite to the first surface. The photoresist layer 210 may be provided or formed on the second surface. The photoresist layer 210 may include a positive photoresist in which a portion exposed to light is removed by a developer.

Figure 7B:
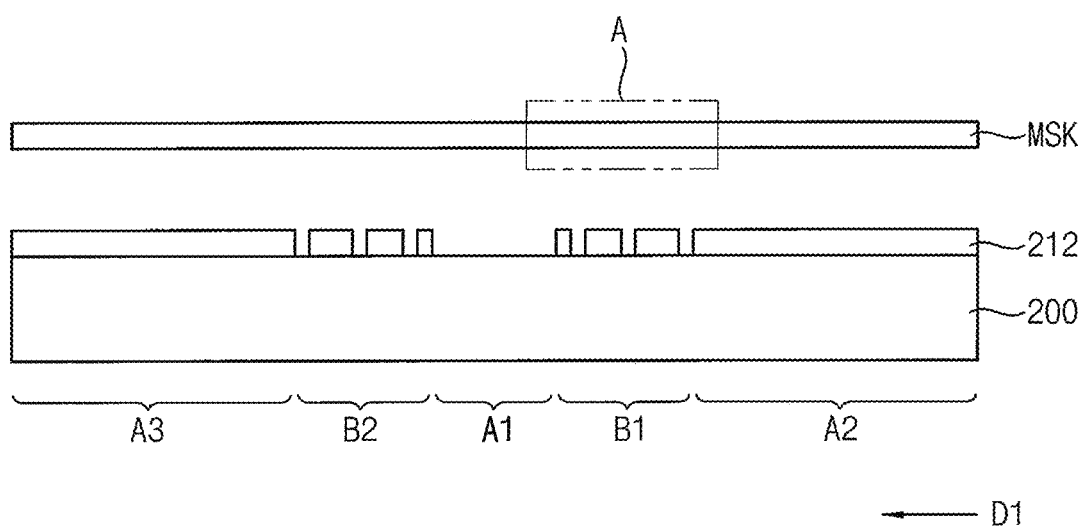
Figure 7C:
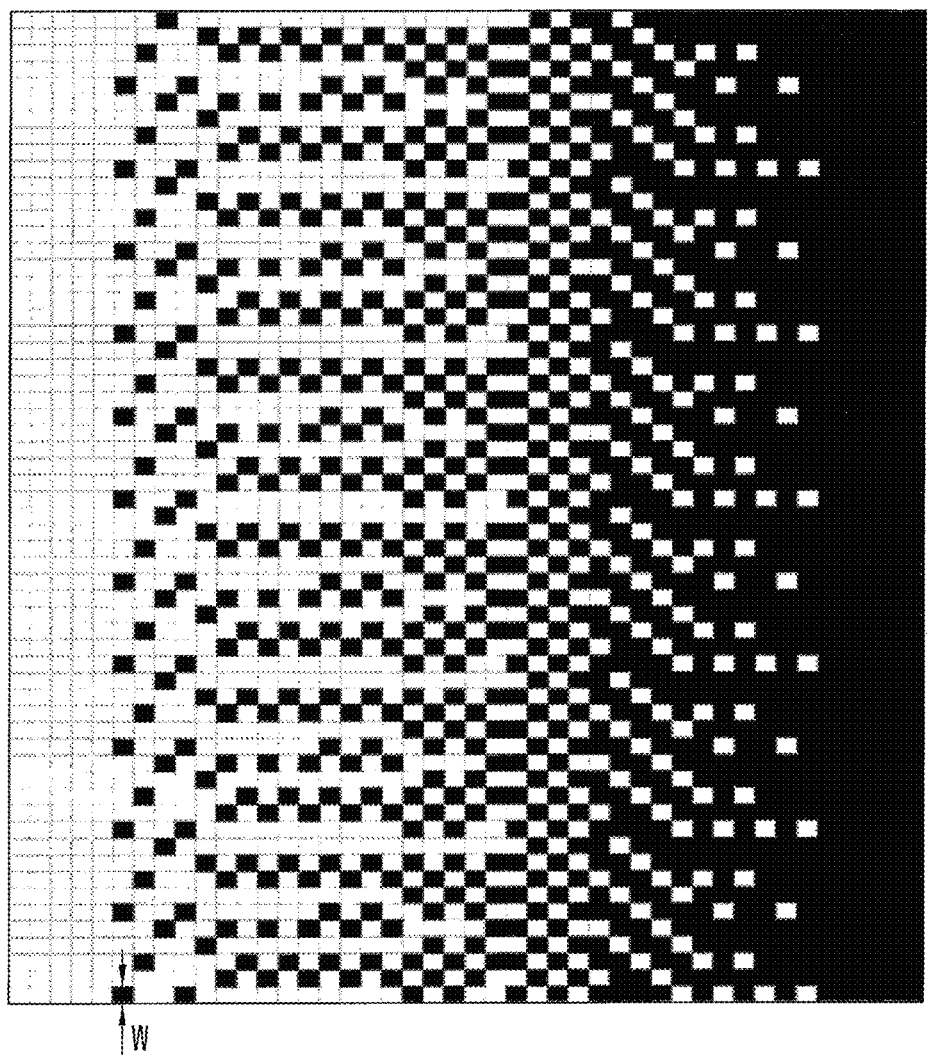

Referring to FIGS. 7B and 7C, the photoresist layer 210 may be exposed to light and developed by using a mask MSK to form a photoresist pattern 212.

In such an embodiment, the window glass 200 may include a second area A2 extending in the second direction, a third area A3 spaced apart from the second area A2 in the first direction D1 perpendicular to the second direction D2 and extending in the second direction D2, a first area A1 disposed between the second area A2 and the third area A3, a first buffer area B1 disposed between the first area A1 and the second area A2, and a second buffer area B2 disposed between the first area A1 and the third area A3.

FIG. 7C is a plan view showing a portion corresponding to a first buffer area B1 of a mask MSK (A' region surrounded by a dotted line in the drawing). In the drawing, a black portion corresponds to a portion in which light is blocked (closed area), and a white portion corresponds to a portion through which the light passes (open area). In such an embodiment, a plurality of opening patterns may be defined through the mask MSK in the first buffer area B1, and an aperture ratio by the opening patterns may gradually increase as being away farther from the second area A2 to the first area.

Accordingly, the photoresist pattern 212 may cover the second surface in the second and third areas A2 and A3, may expose the second surface in the first area A1, and may partially expose the second surface in the first and second buffer areas.

Figure 7D:
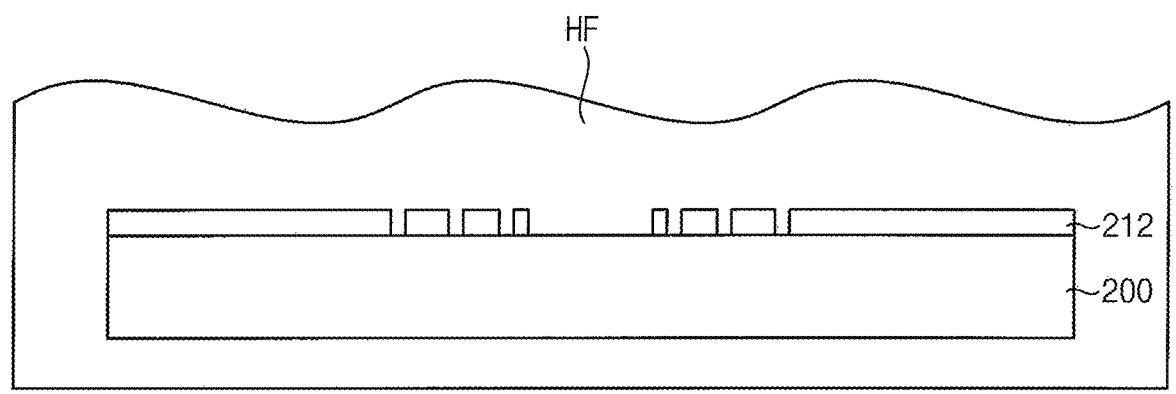

Referring to FIG. 7D, the second surface of the window glass 200 may be etched by using the photoresist pattern 212 as an etching barrier. In one embodiment, for example, through a wet-etching scheme using hydrofluoric acid (HF), the second surface may be etched so that the window glass 200 may have various thicknesses.

Figure 7E:
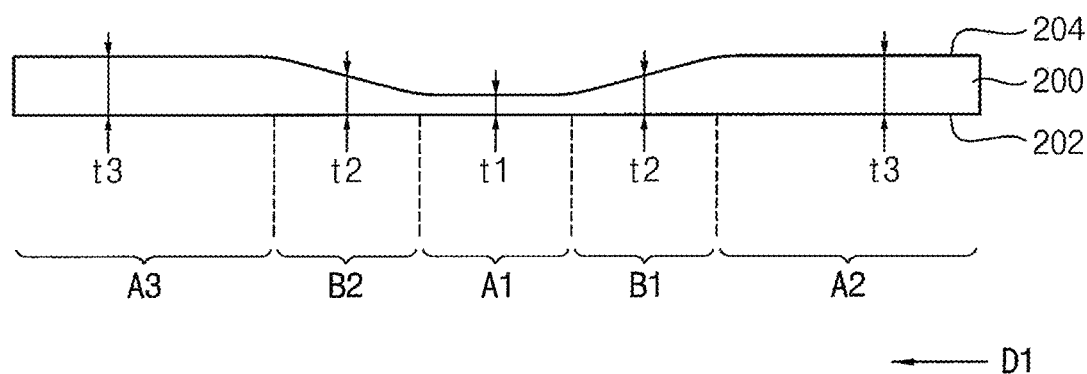

Referring to FIG. 7E, the window glass 200 may be formed by removing the photoresist pattern 212 on the window glass 200. The window glass 200 may have the first thickness t1 in the first area A1, and may have the third thickness t3 greater than the first thickness t1 in the second and third areas A2 and A3. A plurality of groove patterns may be formed in the first buffer area B1 and the second buffer area B2.

The second thicknesses t2 of each of the first and second buffer areas B1 and B2 may gradually increase as moving in the direction from the first area A1 to the second or third areas A2 or A3. In such an embodiment, the groove patterns are formed in the first and second buffer areas B1 and B2, and the second thickness t2 refers to the average thickness.

Figure 7F:
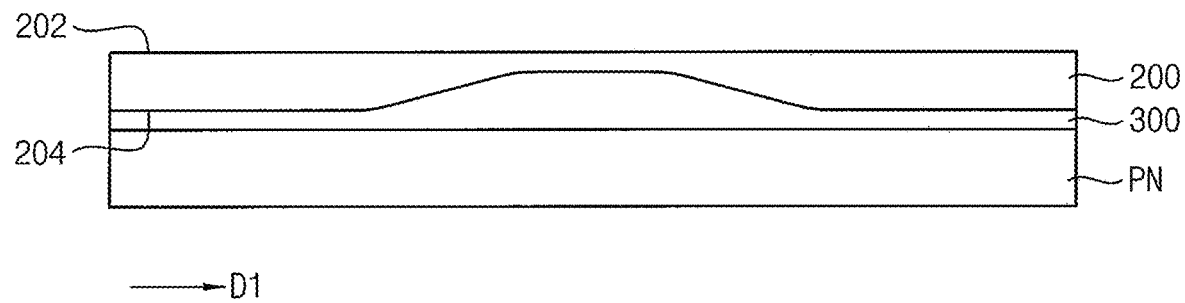

Referring to FIG. 7F, the window glass 200 may be adhered onto the display panel PN by using the adhesive layer 300. The adhesive layer 300 and a second surface 204 of the window glass 200 may make contact with each other, so that a first surface 202 of the window glass 200, which is an uppermost layer of the display device, may be flat.

In an embodiment, as described above with reference to FIG. 6, the display panel PN may be a flexible display panel, may have one of various generally-known structures, and may be manufactured by one of various generally-known schemes. Therefore, detailed descriptions thereof will be omitted.

Figure 8:
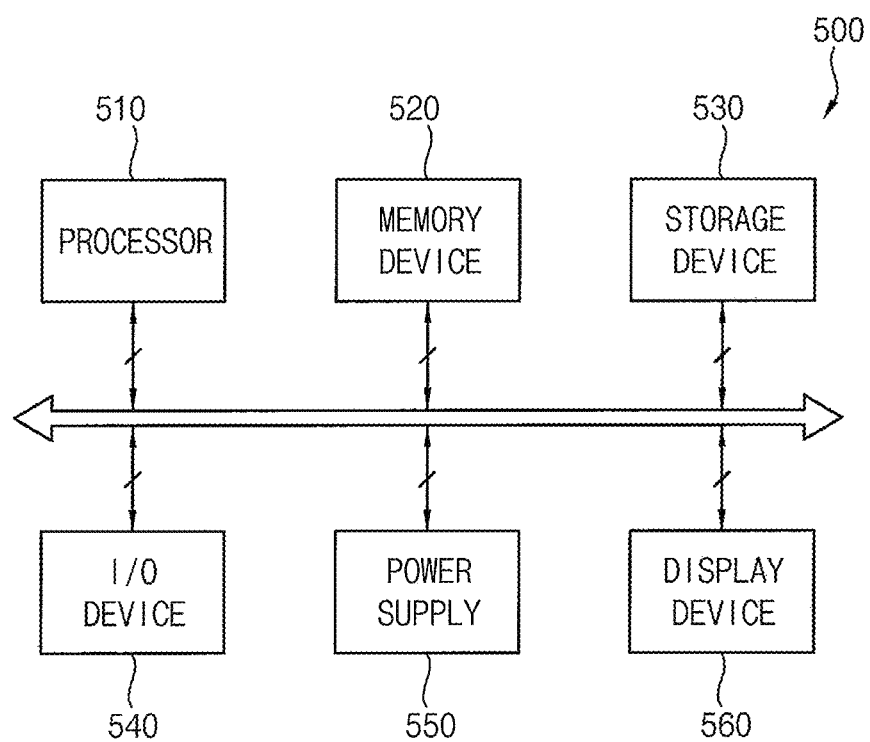
FIG. 8 is a block diagram illustrating an electronic device according to an embodiment.

FIG. 8 is a block diagram illustrating an electronic device according to embodiments.

Referring to FIG. 8, an embodiment of the electronic device 500 may include a processor 510, a memory device 520, a storage device 530, an input/output ("I/O") device 540, a power supply 550, and a display device 560. In an embodiment, the display device 560 may be the display device of FIG. 1. In an embodiment, the electronic device 500 may further include a plurality of ports for communicating with a video card, a sound card, a memory card, a universal serial bus ("USB") device, other electronic devices, etc. In an embodiment, the electronic device 500 may be implemented as a television. In an alternative embodiment, as illustrated in FIGS. 1A and 1B, the electronic device 500 may be implemented as a foldable smart phone. However, the electronic device 500 is not limited thereto. In one embodiment, for example, the electronic device 500 may be implemented as a cellular phone, a video phone, a smart pad, a smart watch, a tablet personal computer ("PC"), a car navigation system, a computer monitor, a laptop computer, a head mounted display ("HMD") device, etc.

The processor 510 may perform various computing functions. The processor 510 may be a microprocessor, a central processing unit (CPU), an application processor ("AP"), etc. The processor 510 may be coupled to other components via an address bus, a control bus, a data bus, etc. In an embodiment, the processor 510 may be coupled to an extended bus such as a peripheral component interconnection ("PCI") bus. The memory device 520 may store data for operations of the electronic device 500. For example, the memory device 520 may include a non-volatile memory device or a volatile memory device. In one embodiment, for example, as the non-volatile memory device may include an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and the volatile memory device may include a dynamic random access memory ("DRAM") device, a static random access memory ("SRAM") device, a mobile DRAM device, etc. The storage device 530 may include a solid state drive ("SSD") device, a hard disk drive ("HDD") device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic device 500.

The display device 560 may be coupled to an component via the buses or other communication links. In an embodiment, the I/O device 540 may include the display device 560. In an embodiment, as described above, the display device 560 may include a window glass including second and third areas having a second thickness and a first area having a first thickness smaller than the second thickness, and the folding is performed in the folding area located in the first area, so that a foldable display device including the window glass, which is foldable with improved protection strength, improved visibility, and reduced manufacturing cost, may be implemented. In such an embodiment, the display device 560 is substantially the same as the embodiments of the display device described above, and any repetitive detailed description thereof will be omitted.

Embodiments of the invention may be applied to an organic light emitting display device and an electronic device including the organic light emitting display device, e.g., a smart phone, a cellular phone, a video phone, a smart pad, a smart watch, a tablet PC, a car navigation system, a television, a computer monitor, a laptop computer, a HMD device, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A window glass, comprising:
a first surface; and
a second surface opposite to the first surface,
wherein a second area extending in a second direction, a third area spaced apart from the second area in a first direction perpendicular to the second direction and extending in the second direction, a first area disposed between the second area and the third area, a first buffer area disposed between the first area and the second area, and a second buffer area disposed between the first area and the third area are defined on the second surface,
wherein the first area has a first thickness, and each of the second and third areas has a second thickness greater than the first thickness, and
wherein a plurality of groove patterns are defined in the first buffer area and the second buffer area and not in the first area.

2. The window glass of claim 1, wherein a density of the groove patterns in the first buffer area increases going farther away from the second area to the first area.

3. The window glass of claim 1, wherein a pattern width of the groove pattern is between about 20 μm and about 30 μm.

4. The window glass of claim 1, wherein an average thickness of the first buffer area decreases going farther away from the second area to the first area.

5. The window glass of claim 1, wherein the second thickness is greater than the first thickness by about 1.5 times or more.

6. The window glass of claim 1, wherein the groove pattern is a pattern in which a density of the groove patterns in the first buffer area increases going farther away from the second area to the first area, and an average thickness of the first buffer area decreases going farther away from the second area to the first area.

7. A display device comprising:
a display panel including a first display area, a second display area spaced apart from the first display area in a first direction, and a folding area disposed between the first display area and the second display area and extending in a second direction perpendicular to the first direction;

an adhesive layer disposed on the display panel; and a window glass disposed on the adhesive layer, wherein the window glass includes:
- a first surface; and
- a second surface opposite to the first surface,
- wherein a second area extending in the second direction, a third area spaced apart from the second area in the first direction and extending in the second direction, a first area disposed between the second area and the third area, a first buffer area disposed between the first area and the second area, and a second buffer area disposed between the first area and the third area are defined on the second surface,
- wherein the first area has a first thickness, and each of the second and third areas has a second thickness greater than the first thickness, and
- wherein a plurality of groove patterns is defined in the first buffer area and the second buffer area and not in the first area.

8. The display device of claim 7, wherein a density of the groove patterns in the first buffer area of the window glass increases going farther away from the second area to the first area.

9. The display device of claim 7, wherein a pattern width of the groove pattern of the window glass is between about 20 μm and about 30 μm.

10. The display device of claim 7, wherein an average thickness of the first buffer area of the window glass decreases going farther away from the second area to the first area.

11. The display device of claim 7, wherein the second thickness of the window glass is greater than the first thickness by about 1.5 times or more.

12. The display device of claim 7, wherein the folding area corresponds to a part of the first area.

13. The display device of claim 7, wherein
the first display area corresponds to the second area, the first buffer area and a part of the first area, and
the second display area corresponds to the third area, the second buffer area and a part of the first area.

14. The display device of claim 7, wherein
the display panel is a flexible display panel, and
the display panel includes a base substrate, a thin film transistor disposed on the base substrate, a light emitting structure disposed on the thin film transistor, and a thin film encapsulation layer disposed on the light emitting structure.

15. The display device of claim 14, wherein
the first surface of the window glass is flat,
a recess is defined in the first area, the first buffer area and the second buffer area on the second surface, and
a part of the adhesive layer is accommodated in the recess.

16. The display device of claim 7, wherein the groove pattern is a pattern in which a density of the groove patterns in the first buffer area increases going farther away from the second area to the first area, and an average thickness of the first buffer area decreases going farther away from the second area to the first area.

17. A method of manufacturing a display device, the method comprising:
preparing a window glass including a first surface and a second surface opposite to the first surface; and
adhering the window glass onto a display panel by using an adhesive layer,
wherein the preparing the window glass includes:
providing a photoresist pattern on the second surface, wherein a second area extending in a second direction, a third area spaced apart from the second area in a first direction perpendicular to the second direction and extending in the second direction, a first area disposed between the second area and the third area, a first buffer area disposed between the first area and the second area, and a second buffer area disposed between the first area and the third area are defined on the second surface;
etching the second surface by using the photoresist pattern as an etching barrier; and
removing the photoresist pattern, and
wherein the etching the second surface includes providing the photoresist pattern to cover the second surface in the second and third areas, to expose the second surface in the first area, and to partially expose the second surface in the first and second buffer areas.

18. The method of claim 17, wherein the etching the second surface further includes wet-etching the window glass by using hydrofluoric acid.

19. The method of claim 17, wherein
a plurality of opening patterns is defined through the photoresist pattern in the first buffer area, and
an aperture ratio by the opening patterns increases going farther away from the second area to the first area.

20. The method of claim 19, wherein the opening patterns are patterns in which the density of the groove patterns in the first buffer area increases going farther away from the second area to the first area.

\* \* \* \* \*